United States Patent
Shimizu (10) Patent No.: US 9,883,617 B2
(45) Date of Patent: Jan. 30, 2018

(54) AIR-CONDITIONING CONTROL APPARATUS FOR DATA CENTER

(71) Applicant: Hitachi, Ltd., Tokyo (JP)

(72) Inventor: Hayato Shimizu, Tokyo (JP)

(73) Assignee: HITACHI, LTD., Tokyo (JP)

( * ) Notice: Subject to any disclaimer, the term of this patent is extended or adjusted under 35 U.S.C. 154(b) by 396 days.

(21) Appl. No.: 14/191,986

(22) Filed: Feb. 27, 2014

(65) Prior Publication Data
US 2014/0238656 A1 Aug. 28, 2014

(30) Foreign Application Priority Data
Feb. 28, 2013 (JP) .................................. 2013-038342

(51) Int. Cl.
*H05K 7/20* (2006.01)
(52) U.S. Cl.
CPC ............................... *H05K 7/20836* (2013.01)
(58) Field of Classification Search
CPC ........... H05K 7/20836; H05K 7/20709; H05K 7/20209
See application file for complete search history.

(56) References Cited

U.S. PATENT DOCUMENTS

| | | | | |
|---|---|---|---|---|
| 2004/0153430 A1* | 8/2004 | Sayad | ............... | G06F 17/30598 706/61 |
| 2004/0252456 A1* | 12/2004 | Larson | ...................... | G06F 1/20 361/694 |
| 2006/0047808 A1* | 3/2006 | Sharma | .................... | G06F 9/505 709/224 |
| 2006/0168975 A1* | 8/2006 | Malone | .................. | F24F 11/001 62/180 |
| 2006/0206291 A1* | 9/2006 | Bash | .................... | G05B 13/027 702/194 |
| 2006/0225446 A1* | 10/2006 | Bash | ....................... | F24F 3/048 62/178 |
| 2006/0259621 A1 | 11/2006 | Ranganathan et al. | | |
| 2006/0259793 A1* | 11/2006 | Moore | .................... | G06F 1/206 713/300 |
| 2007/0074866 A1* | 4/2007 | Bhatti | ................ | H05K 7/20736 165/248 |

(Continued)

FOREIGN PATENT DOCUMENTS

| | | |
|---|---|---|
| JP | 2004-126968 A | 4/2004 |
| JP | 2007-179437 A | 7/2007 |

(Continued)

*Primary Examiner* — Ljiljana Ciric
*Assistant Examiner* — Alexis Cox
(74) *Attorney, Agent, or Firm* — Baker Botts L.L.P.

(57) ABSTRACT

An air conditioning system having an inlet air temperature calculating block that calculates a variation in air temperature at an inlet port of each unit based on position information and also calculate the air flow rate through each unit. A temperature sensitivity calculating block calculates temperature sensitivity of each unit obtained by dividing the variation in air temperature at the inlet port by a variation in air temperature at an outlet port of each unit. An inlet air temperature calculating block calculates the air temperature at the inlet port of each unit on the basis of the air temperature at the outlet port of each unit, and the temperature sensitivity.

5 Claims, 10 Drawing Sheets (56) References Cited

U.S. PATENT DOCUMENTS

| | | | | |
|---|---|---|---|---|
| 2012/0232877 A1* | 9/2012 | Bhagwat | ............ | H05K 7/20836 |
| | | | | 703/13 |
| 2013/0081034 A1* | 3/2013 | Shimizu | .................. | G06F 1/206 |
| | | | | 718/102 |
| 2013/0151019 A1* | 6/2013 | Federspiel | ............... | F24F 11/00 |
| | | | | 700/276 |
| 2013/0238141 A1* | 9/2013 | Shimizu | .................. | G06F 1/206 |
| | | | | 700/276 |

FOREIGN PATENT DOCUMENTS

| | | |
|---|---|---|
| JP | 2011-034578 A | 2/2011 |
| JP | 2013-73413 A | 4/2013 |

* cited by examiner

AIR-CONDITIONING CONTROL APPARATUS FOR DATA CENTER

BACKGROUND OF THE INVENTION

1. Field of the Invention

The present invention relates generally to air-conditioning control apparatuses that control air conditioners and other cooling equipment. More particularly, the invention relates to an air-conditioning control apparatus that controls cooling equipment for a data center in which is installed an information-processing system that includes information-processing units such as server units and the cooling equipment that cools such information-processing units.

2. Description of the Related Art

Information-processing units such as server units have increased remarkably. For cooling of heat generated in such units, accordingly, electric power that cooling equipment consumes, i.e., electric power for cooling has also increased. This leads to a problem with overall power reduction in which electric power consumed by the information-processing units and electric power consumed for cooling of these units are considered totally.

Efforts associated with electric power saving in information-processing units, cooling equipment, and their operational management are made with a view towards saving electric power in data centers.

These efforts in information-processing units are being made by improving performance per power consumption by the use of lower-power devices, and by adopting a function that saves power by switching an operation state according to workload.

In cooling equipment, efforts are being made by improving the operating efficiency of the installed air conditioners, by optimizing the airflow design of air supply and exhaust ports, and by introducing local cooling or liquid cooling.

In terms of operational management, efforts are being undertaken primarily in the forms of operating state information monitoring, job scheduling, and the operating efficiency improvement and consolidation of hardware by virtualization.

Cooling equipment such as air conditioners is generally designed in accordance with a maximum total electric power rating of information-processing units. During actual equipment operation, however, not all of the information-processing units are used and loads of the information-processing units actually used do not always become a maximum, either.

With the future progress of the operational management technology for data centers, the consolidation of the information-processing units is expected to be further utilized by the use of virtualizing technology to save electric power.

To ensure electric power saving in a data center under such circumstances, it is effective to implement measures towards reduced overall electric power of cooling equipment allowing for the possible non-uniformity and hourly variations in a power distribution of information-processing units with respect to the cooling equipment.

Referring to the reduction in the overall electric power of the cooling equipment, there are several known operational management methods for the information-processing system that includes the information-processing units and the cooling equipment.

Firstly, in a management server that conducts job scheduling upon parallel computers is known a method for loading a new job into a computer with less heat (this indicates that the computer is not too heavily loaded) in accordance with computer temperature sensor information, next moving a job from a computer with high heat (this indicates that the computer is heavily loaded), into the lower-temperature computer, and thus preventing a failure in the parallel computers or a decrease in performance of these computers from resulting from high temperatures. This method is described in, for example, JP-2004-126968-A (referred to as Patent Document 1). In this method, whether the movement of the job can be executed is determined by estimating, from temperature information, the amount of electric power consumed by the corresponding computers before and after the movement of the job, and the amount of electric power consumed by cooling units provided for each computer.

Secondly, in a management system for a plurality of computers is known a method for selecting a computer of a relatively high temperature (a heavily loaded computer) and a computer of a relatively low temperature (a lightly loaded computer) in accordance with a temperature distribution of and operating state information about the computers, next moving software from the higher-temperature computer and the lower-temperature computer, and thus saving electric power. This method is described in, for example, JP-2007-179437-A (referred to as Patent Document 2). In this method, whether the movement of the software can be executed is determined by comparing variations in the amount of electric power consumed by the selected computers before and after the movement of the software, and in the amount of electric power consumed by air conditioners. The power consumption in the computers is calculated from operating state information, the power consumption in the air conditioners is calculated from the temperature distribution, and the temperature distribution is calculated from temperature sensor information, temperature histories, and the operating state information.

Thirdly, in a known method of allocating a workload to a plurality of servers present in a data center, a profile of a requested workload is compared with historical workload profiles, next the requested workload is allocated to the servers in accordance with a historical workload profile denoting the fact that the amount of electric power consumed by the servers and air conditioners is minimized, and if a matching history is absent, the workload is allocated in a random manner. This method is described in, for example, US Patent Application Serial No. 2006/0259621 (referred to as Patent Document 3). In this method, the historical workload profile contains server locations, classes, and operating state information, server intake air temperatures and exhaust air temperatures, workload types, and the amount of electric power consumed by the servers and the air conditioners. The amount of electric power consumed by the servers and the air conditioners is either calculated from the server intake air temperatures and exhaust air temperatures, specific heat, and the quantities of air, or measured by a wattmeter.

Fourthly, in a known method of distributing electric power to a plurality of servers present in a data center, the occurrence of server failures due to hot spots or cold spots can be prevented by lending and borrowing a power budget between geographically adjacent servers or racks so that the distribution of the power approaches an ideal analog-like temperature distribution, or power distribution, and specifying discretized power states of the servers according to the particular budget allocations. This method is described in, for example, US Patent Application Serial No. 2006/0259793 (referred to as Patent Document 4). In this method, thermal multipliers that denote ideal power for the servers are determined from exhaust air temperatures of the servers, a reference exhaust air temperature of an average server, and supply air temperatures of air conditioners.

Fifthly, there is a known method in which an air conditioner operating coefficient relating to information-processing units is calculated for air conditioners and a unit-related power consumption scheme is created for the information-processing units. This method is described in, for example, JP-2011-34578-A (referred to as Patent Document 5). In this method, a power-saving performance evaluation index based on the unit-related power consumption scheme for the information-processing units is used to determine workload allocations for power saving in the entire computer room. In this known method, a workload of the information-processing units is controlled in accordance with workload allocation results, power consumption in the air conditioners is calculated from the air conditioner operating coefficient and a measured value of power consumption in the information-processing units, and air conditioner output is controlled.

SUMMARY OF THE INVENTION

In the method as presented in Patent Document 1, the job is allocated to the computer with less heat that is included in the parallel computers, but this does not always lead to power savings. In addition, since the amount of the power consumption is considered before and after the movement of the job for only the computers corresponding to the movement source and the movement destination, although power usage levels of the computers in question decrease, such power saving is nothing more than local power saving in all parallel computers. Briefly, overall power saving in the data center (the computer room) cannot be achieved.

In the method as presented in Patent Document 2, while the variations in the power consumption of the computers and those of the air conditioner power consumption are compared, the variations in power consumption are only compared between the selected computer with high heat and computer with less heat, and the comparison between the other computers are omitted. Thus, no consideration is given to the overall power of the computers and the air-conditioning equipment combined therewith. Briefly, overall power saving in the data center (the computer room) cannot be achieved.

In the method as presented in Patent Document 3, the workload is allocated in accordance with a historical workload profile denoting the fact that the amount of electric power consumed by the servers and air conditioners is minimized. Therefore, when the particular historical workload profile is present, overall power of the servers and air conditioners combined can be reduced, whereas when the historical workload profile is absent, the overall power of the computers and air-conditioning equipment combined cannot be reduced. Since the accumulation of historical workload profiles takes time, a long time is needed before overall power saving in the data center (the computer room) can be achieved. Briefly, overall power saving in the data center (the computer room) cannot be achieved rapidly.

In the method as presented in Patent Document 4, the power budget is lent and borrowed between the adjacent servers so that the distribution of the power approaches an ideal analog-like temperature distribution, but total power of all servers is not always reduced. Briefly, overall power saving in the data center (the computer room) cannot be achieved.

In the method as presented in Patent Document 5, power saving in the computer room can be achieved by optimizing the allocation of the workload to the information-processing units. In this method, a very large amount of calculation time is necessary for calculating the power-saving performance evaluation index. To implement this method, therefore, it is absolutely necessary to provide a special server for the calculation, so under a simplified configuration, overall power saving in the data center (the computer room) cannot be achieved.

An object of the present invention is to provide an air-conditioning control apparatus adapted to achieve overall power saving with a simplified configuration in a data center.

In order to attain the above object, the present invention includes a differential inlet air temperature calculating block (a differential inlet air temperature calculator) that calculates a variation $\Delta T_{in}(i)$, where i=1 to N, in a temperature of air at an inlet port of the ith unit, on the basis of position information denoting a position of an ith unit and the air flow rate $Q(i)$ through the ith unit. The invention also includes a temperature sensitivity calculating block (a temperature sensitivity calculator) that calculates temperature sensitivity $a(i, j)$ denoting a value obtained by dividing the variation $\Delta T_{in}(i)$ by a variation $\Delta T_{out}(j)$ in a temperature of air at an outlet port of the jth unit, where j=1 to N. In addition, the invention includes an inlet air temperature calculating block (an inlet air temperature calculator) that calculates the temperature $T_{in}(i)$ of the air at the inlet port of the ith unit on the basis of the air temperature $T_{out}(j)$ at the outlet port of the jth unit and the calculated temperature sensitivity $a(i, j)$. The invention further includes a maximum value determining block (a maximum value determiner) that determines a maximum value M of the temperature $T_{in}(i)$, and an air conditioner control block (an air conditioner controller) that controls temperatures of air conditioners to prevent the maximum value M from exceeding a predetermined threshold value.

The present invention enables overall power saving in a data center to be achieved with a simplified configuration. Other objects, configurations, and advantageous effects will be apparent in the following description of embodiments of the invention illustrated in the accompanying drawings.

DESCRIPTION OF THE PREFERRED EMBODIMENTS

First Embodiment

Hereunder, a configuration and operation of an air-conditioning control apparatus 300 which is a first embodiment of the present invention will be described using FIGS. 1 to 7. The air-conditioning control apparatus 300 controls air conditioners 200 in a data center 400.

Figure 1:
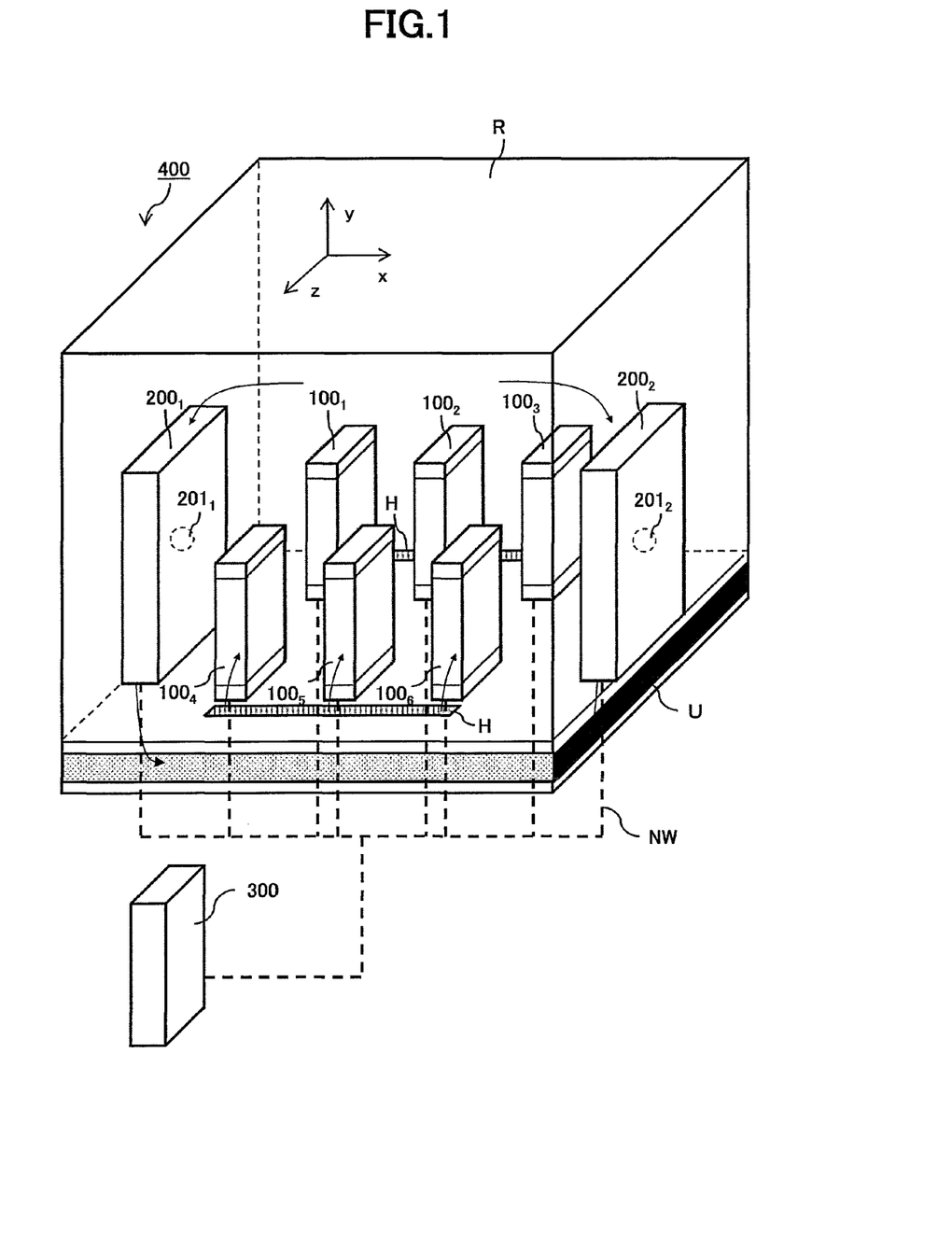
FIG. 1 is a configuration diagram of a data center including an air-conditioning control apparatus which is a first embodiment of the present invention.

First, an overall configuration of the data center 400 including the air-conditioning control apparatus 300, the first embodiment of the present invention, is described below using FIG. 1. FIG. 1 is a configuration diagram of the data center 400 including the air-conditioning control apparatus 300, the first embodiment of the present invention.

The data center 400 includes six information-processing units 100 ($100_1$ to $100_6$), two air conditioners 200 ($200_1$ and $200_2$), and one air-conditioning control apparatus 300. The number of units of each element constituting the data center 400 is not limited to the shown number.

In the present embodiment, the information-processing units $100_1$-$100_6$ and the air conditioners $200_1$-$200_2$ are placed inside a computer room R. The air-conditioning control apparatus 300, on the other hand, is placed in any room provided in the data center 400. The air-conditioning control apparatus 300 may however be placed inside the computer room R.

The information-processing units 100 each include an IT device rack that contains a plurality of IT devices. Each information-processing unit 100 may be one general server unit. Further details of the information-processing unit 100 will be described later herein using FIG. 2.

The air conditioners 200 each change an outlet air temperature in accordance with a command from the air-conditioning control apparatus 300.

More specifically, each air conditioner 200 includes a control unit 201 such as a central processing unit (CPU). The control unit 201 controls and manages air conditioning to ensure that an air-conditioning air volume, temperature, and the like match to respective settings, based on a set air-conditioner air volume and a set refrigeration ability (a set outlet temperature), both of which are information supplied from the air-conditioning control apparatus 300.

The control unit 201 also transmits current operating state quantities of the air conditioner 200, that is, a current air volume and current inlet and outlet air temperatures, and air conditioner compressor data such as power consumption, or quantities representing these values, such as air fan speeds (revolution speed), to the air-conditioning control apparatus 300 via a communications network NW.

In the present embodiment, the data center 400 has a floor of a double structure. Air that has been released from a bottom section of the air conditioner 200 flows through an underfloor space U and after flowing upward through a ventilation hole on the floor, flows into an air inlet surface of each information-processing unit 100, that is, a front face of the IT device rack.

As the air that has been drawn in from the inlet surface passes through the information-processing unit 100, heat arising from each IT device contained in the rack will be transmitted to the air.

More specifically, a cooling fan, built into the IT device, draws in air from the inlet surface of the information-processing unit 100, and the air undergoes heat exchange with the IT device (heating body) mounted in the information-processing unit 100. The air that has undergone the heat exchange is discharged from an air discharge surface of the information-processing unit 100.

The air-conditioning control apparatus 300 transmits to the air conditioner 200 a command specifying a temperature of the outlet air, that is, the set temperature of the air conditioner. A configuration of the air-conditioning control apparatus 300 will be described in detail later herein using FIG. 3.

The information-processing unit 100, the air conditioner 200, and the air-conditioning control apparatus 300 are connected to one another via the communications network NW.

Figure 2:
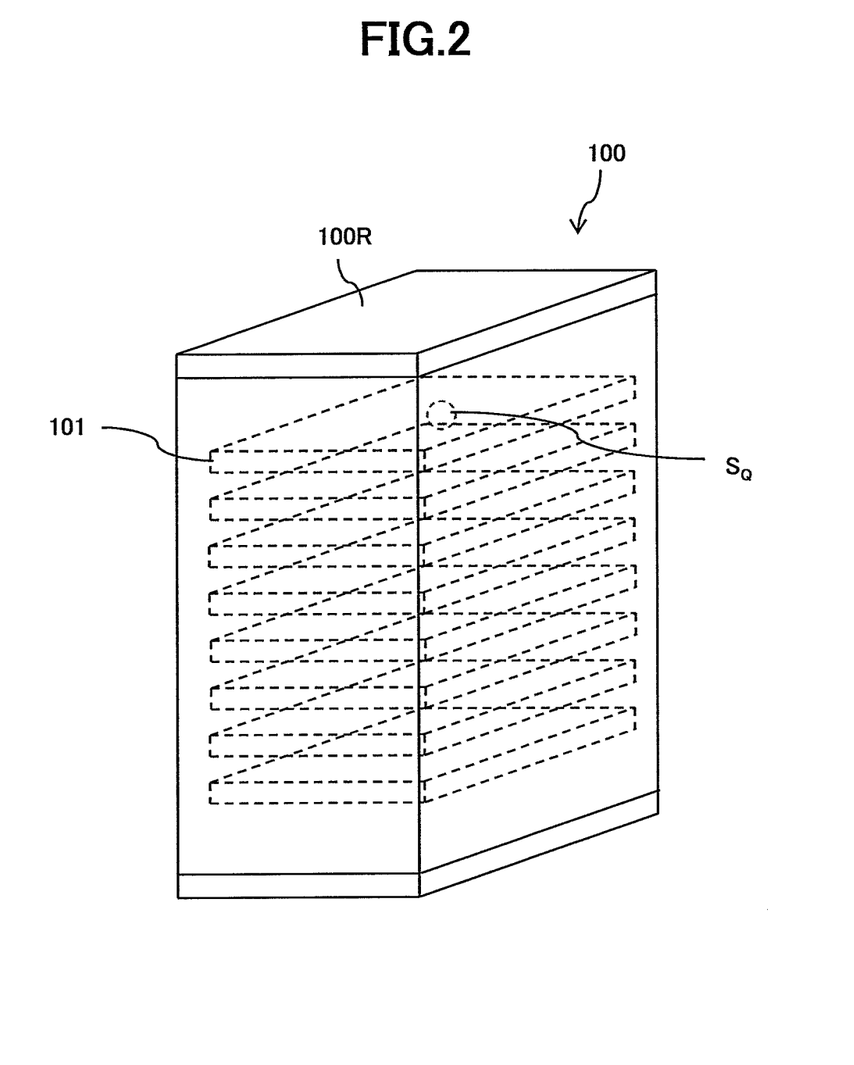
FIG. 2 is a configuration diagram of an information-processing unit installed in the data center including the air-conditioning control apparatus, the first embodiment of the present invention.

Next, a configuration of one information-processing unit 100 placed in the data center 400 including the air-conditioning control apparatus 300, which is the first embodiment of the present invention, is described below using FIG. 2. FIG. 2 is a configuration diagram of the information-processing unit 100 installed in the data center 400 including the air-conditioning control apparatus 300, the first embodiment of the present invention.

The information-processing unit 100 includes the IT device rack 100R and the plurality of IT devices 101. Each of the IT devices 101 is, for example, a blade server, a storage, a router, or the like. The IT device 101 is disposed on a shelf provided inside the IT rack 100R.

The IT device 101 includes a sensor $S_Q$ that senses and measures a quantity (e.g., fan speed) representing the air flow rate Q(i) of the air flowing through the IT device 101. The value that has been measured by the sensor $S_Q$ is transmitted to and stored into the air-conditioning control apparatus 300.

Figure 3:
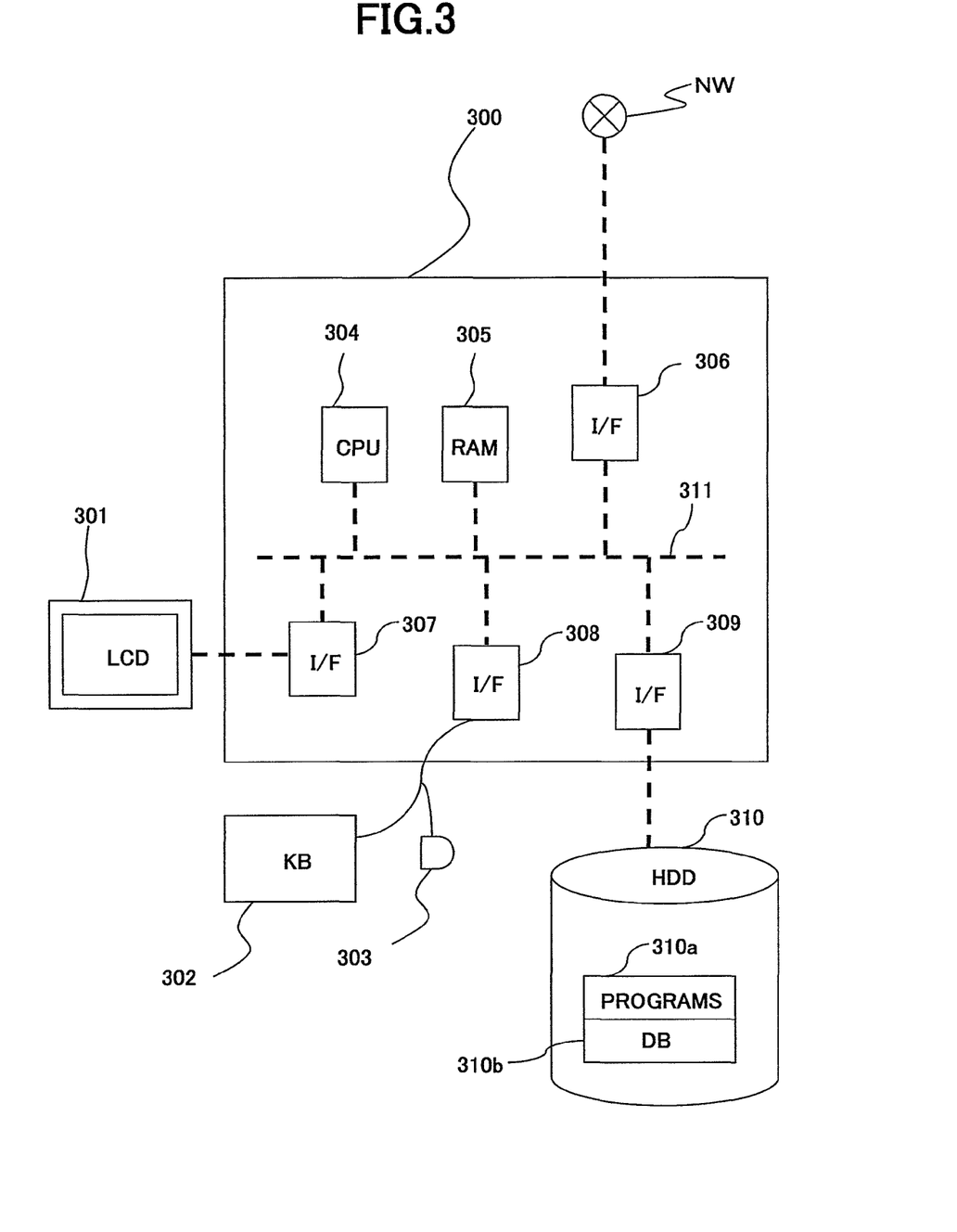
FIG. 3 is a configuration diagram of the air-conditioning control apparatus, the first embodiment of the present invention.

Next, a configuration of the air-conditioning control apparatus 300, the first embodiment of the present invention, is described below using FIG. 3. FIG. 3 is a configuration diagram of the air-conditioning control apparatus 300, the first embodiment of the present invention.

The air-conditioning control apparatus 300 includes the CPU 304, a main storage device 305, a network I/F 306, a graphic I/F 307, an input/output I/F 308, and an auxiliary storage device I/F 309. These devices are connected to a bus 311.

The CPU 304 operates as a control unit to control various sections of the air-conditioning control apparatus 300, load predetermined modules (programs) for operational management into the main storage device 305, and execute the modules (programs).

The main storage device 305 includes a volatile memory such as a random-access memory (RAM). A program that the CPU 304 executes, and data that the CPU 304 accesses are loaded into the main storage device 305.

The network I/F 306 is an interface for establishing connection to the communications network NW.

The graphic I/F 307 is an interface for connecting a display unit 301 such as an LCD (Liquid-Crystal Display).

The input/output I/F 308 is an interface for connecting input/output devices. A keyboard 302 and a mouse 303 as a pointing device, are connected to the input/output I/F in the example shown as FIG. 3.

The auxiliary storage device I/F 309 is an interface for connecting an auxiliary storage device 310 such as a hard-disk drive (HDD).

The auxiliary storage device 310 is constituted by, for example, a HDD of a large-capacity. A program 310a for operational management, and a database 310b are stored within the auxiliary storage device 310.

Figure 4:
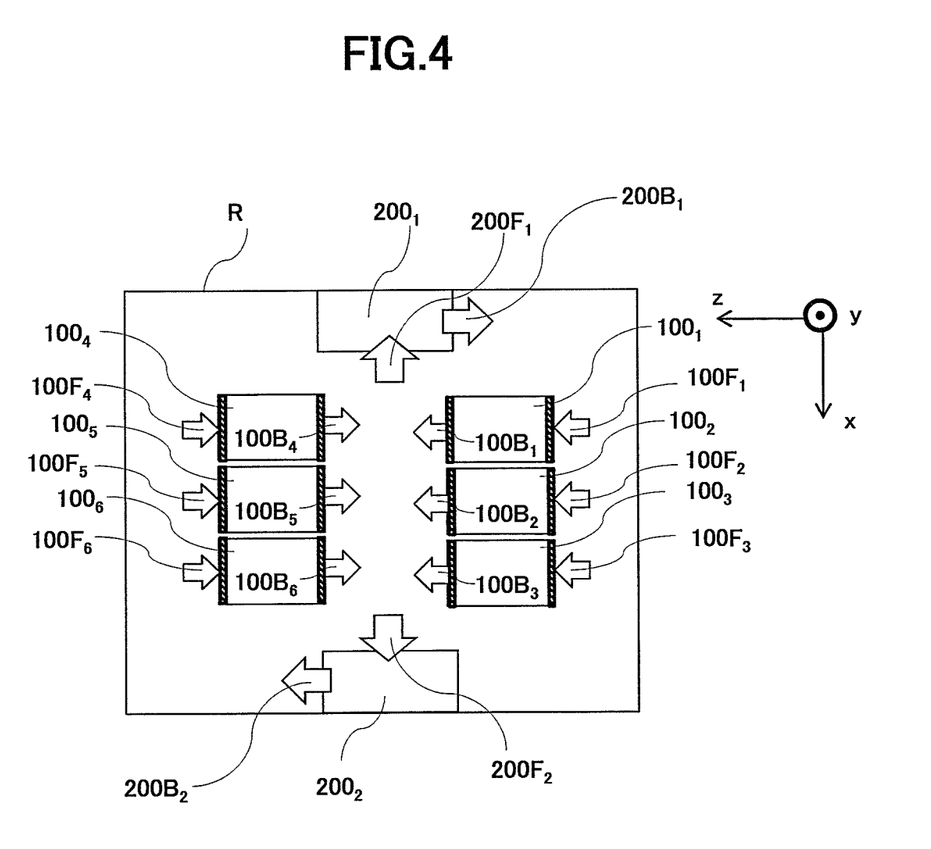
FIG. 4 is a diagram illustrating a flow of air in a computer room whose air conditioning is controlled by the air-conditioning control apparatus, the first embodiment of the present invention.

Next, a flow of air in the computer room R whose air conditioning is controlled by the air-conditioning control apparatus 300, the first embodiment of the present invention, is described below using FIG. 4. FIG. 4 is a diagram for describing the flow of air in the computer room R whose air conditioning is controlled by the air-conditioning control apparatus 300, the first embodiment of the present invention. In FIG. 4, the same elements as in FIG. 1 are each assigned the same reference number.

Each of the air conditioners 200 ($200_1$ and $200_2$) includes an inlet port 200F ($200F_1$ or $200F_2$) that recovers air from the computer room R, and an outlet port 200B ($200B_1$ or $200B_2$) that discharges the recovered and cooled air to the computer room R.

The inlet ports 200F and outlet ports 200B of each air conditioner 200 are schematically depicted with an arrow in FIG. 4. Similarly, inlet ports 100F and outlet ports 100B of each information-processing unit 100, described later herein, are schematically depicted.

The information-processing unit 100 includes an inlet port 100F (one from $100F_1$ to $100F_6$) that draws in air, and an outlet port 100B (one from $100B_1$ to $100B_6$) that discharges to the computer room R the air that has been heated by the IT devices 101 built into the processing unit 100. Thus the information-processing unit 100 can release the heat that the IT devices 101 have generated, to the computer room R.

The information-processing unit 100 here may also include a capping duct (a sheet-like element of a four-sided shape that forms an air pathway to guide the air discharged from a rear face of each IT device 101), a capping curtain, or any other static control section, at a location of the outlet port 100B. The information-processing unit 100 may further include a louver, a porous plate, or any other dynamic control section, at the location of the outlet port 100B. The dynamic control section is controlled by the air-conditioning control apparatus 300.

Figure 5:
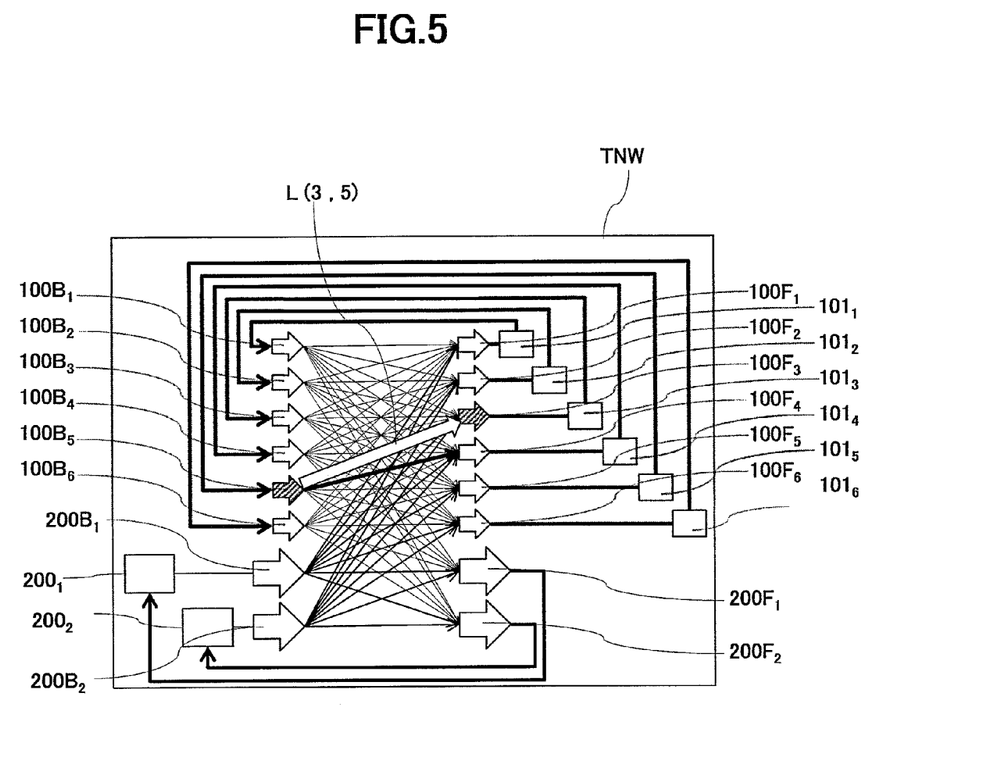
FIG. 5 is a schematic diagram of a thermal network in the computer room whose air conditioning is controlled by the air-conditioning control apparatus, the first embodiment of the present invention.

Next, a thermal network TNW in the computer room R whose air conditioning is controlled by the air-conditioning control apparatus 300, the first embodiment of the present invention, is described below using FIG. 5. FIG. 5 is a schematic diagram showing the thermal network TNW in the computer room R whose air conditioning is controlled by the air-conditioning control apparatus 300, the first embodiment of the present invention. In FIG. 5, the same elements as in FIG. 4 are each assigned the same reference number.

Connections from the outlet ports $100B_1$-$100B_6$ of the information-processing units 100 and the outlet ports $200B_1$-$200B_2$ of the air conditioners 200 to the inlet ports $100F_1$-$100F_6$ of the information-processing units 100 and the inlet ports $200F_1$-$200F_2$ of the air conditioners 200, with each of the outlets and inlets taken as a nodal point, are depicted as linking elements in FIG. 5. Arrows shown with a solid line in FIG. 5 each represent a flow of heat energy.

For descriptive simplicity, FIG. 5 assumes that only one IT device 101 is contained in each information-processing unit 100.

As a heating element, the IT device $101_1$-$101_6$ generates a quantity of heat that depends on its power consumption.

As an element that discharges air of a set constant temperature, each air conditioner 200 lowers the temperature of the air which has been drawn in from the inlet port 200F, according to the particular refrigeration capabilities of the air conditioner, and discharges the air from the outlet port 200B.

The information-processing unit $100_1$-$100_6$ and the air conditioner $200_1$-$200_2$ are hereinafter termed "ith" units in that order. In this ordinal numbering scheme, no distinction is drawn between the information-processing unit 100 and the air conditioner 200. First to eighth units exist in the example shown as FIG. 5.

A linking element heading from the outlet port of a "jth" unit, toward the inlet port of an "ith" unit, is expressed as L(i, j). Referring to the example in FIG. 5, a linking element heading from the outlet port $100B_5$ of the information-processing unit $100_5$, toward the inlet port $100F_3$ of the information-processing unit $100_3$, is expressed as L(3, 5). The number of linking elements L(i, j) in FIG. 5 is 8×8=64.

Characteristics of each linking element L(i, j) are determined by the air flow rate and temperature sensitivity. The flow rate of air from the outlet port of the jth unit into the inlet port of the ith unit is expressed as q(i, j).

Also suppose that when the temperature of the air at the outlet port of the jth unit changes by $\Delta T_{out}(j)$ the temperature of the air at the inlet port of the ith unit changes by $\Delta T_{in}(i)$. In this case, the temperature sensitivity a(i, j) of the linking element L(i, j) is defined by following equation (1):

$$a(i, j) = \frac{\Delta T_{in}(i)}{\Delta T_{out}(j)} \quad (1)$$

That is to say, the temperature sensitivity a(i, j) denotes an increment (difference) that the temperature of the air at the inlet port of the ith unit experiences in a case that the temperature of the air at the outlet port of the jth unit increases by unit temperature (1° C., for example). In addition, following equation (2) is derived from equation (1):

$$T_{in}(i) = \sum_j a(i, j) * T_{out}(j) \quad (2)$$

In accordance with equation (2), the temperature $T_{in}(i)$ of the air at the inlet port of the ith unit is obtained from the temperature sensitivity a(i, j) and the temperature $T_{out}(j)$ of the air at the outlet port of the jth unit.

The air flow rate through the ith unit, on the other hand, is defined by following equation (3):

$$Q(i) = \sum_j q(i, j) \quad (3)$$

By the way, in the computer room R of the data center 400, cold air is supplied from the air conditioner 200 and this causes forced convection of air. In consideration of a balance of the quantity of heat, following equation (4) holds:

$$Q(i) * T_{in}(i) = \sum_j q(i, j) * T_{out}(j) \quad (4)$$

The following equation is derived from equations (2), (4):

$$Q(i) * \sum_j a(i, j) * T_{out}(j) = \sum_j q(i, j) * T_{out}(j) \quad (5)$$

Equation (5) becomes an identity for an index "j," so following equation (6) holds:

$$Q(i)*a(i,j)=q(i,j) \quad (6)$$

Equation (7) is derived from equation (6).

$$a(i, j) = \frac{q(i, j)}{Q(i)} \quad (7)$$

The temperature sensitivity a(i, j) indicates a ratio of q(i, j) with which air flows from the outlet port of the jth unit into the inlet port of the ith unit, to the air flow rate Q(i) through the ith unit. In other words, the temperature sensitivity a(i, j) denotes a flow distribution ratio.

There is no method for directly measuring the flow rate q(i, j) which flows between units. Since the temperature sensitivity a(i, j) can be calculated from equation (1), however, the flow rate, q(i, j), can be calculated using equation (6).

Figure 6:
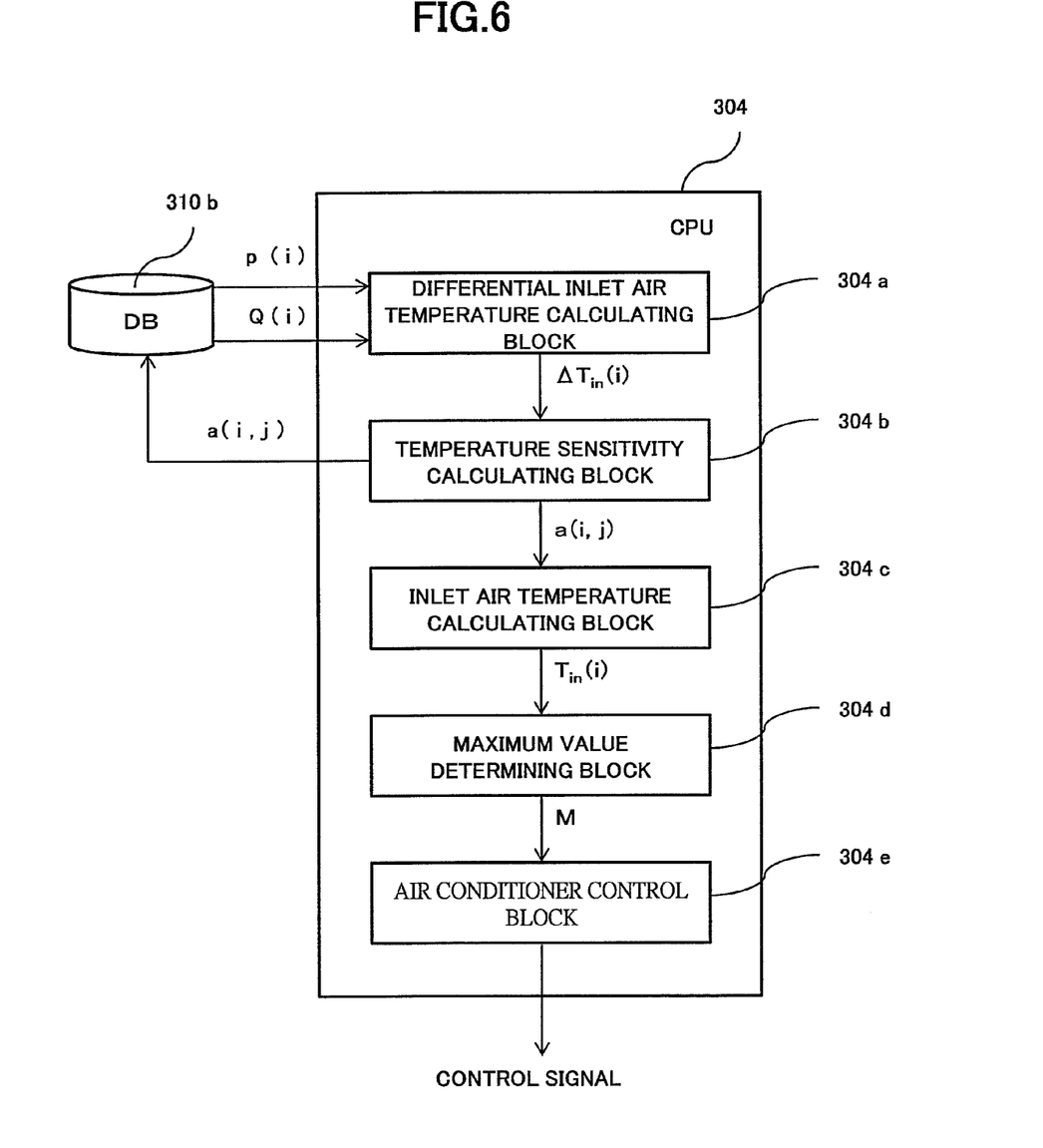
FIG. 6 is a diagram for describing functions of the air-conditioning control apparatus, the first embodiment of the present invention.

Next, functions of the air-conditioning control apparatus 300, the first embodiment of the present invention, are described below using FIG. 6. FIG. 6 is a diagram for describing the functions of the air-conditioning control apparatus 300, the first embodiment of the present invention.

The CPU 304 of the air-conditioning control apparatus 300 includes a differential inlet air temperature calculating block (a differential inlet air temperature calculator) 304a, a temperature sensitivity calculating block (a temperature sensitivity calculator) 304b, an inlet air temperature calculating block (an inlet air temperature calculator) 304c, a maximum value determining block (a maximum value determiner) 304d, and an air conditioner control block (an air conditioner controller) 304e.

On the basis of position information p(i) and flow rate Q(i) relating to each unit, both stored within the database (DB) 310b, the differential inlet air temperature calculating block 304a calculates the variation $\Delta T_{in}(i)$ in the temperature of the air at the inlet port of the ith unit and supplies the calculated variation $\Delta T_{in}(i)$ to the temperature sensitivity calculating block 304b.

The temperature sensitivity calculating block 304b calculates the temperature sensitivity a(i, j) based on the variation $\Delta T_{in}(i)$ in the temperature of the air at the inlet port of the ith unit, and supplies the calculated temperature sensitivity a(i, j) to the inlet air temperature calculating block 304c.

The inlet air temperature calculating block 304c calculates the temperature $T_{in}(i)$ of the air at the inlet of the ith unit on the basis of the temperature sensitivity a(i, j), and supplies the calculated inlet air temperature $T_{in}(i)$ to the maximum value determining block 304d.

The maximum value determining block 304d determines the maximum value M of the inlet air temperature $T_{in}(i)$ and supplies the maximum value M to the air conditioner control block 304e.

The air conditioner control block 304e transmits to the air conditioner 200 a control signal as a command to control the temperature setting of the air conditioner 200.

Further details of the function blocks 304a-304e will be described later herein using FIG. 7.

Next, operation of the air-conditioning control apparatus 300, the first embodiment of the present invention, is described below using FIG. 7. FIG. 7 is a flowchart that shows an operation sequence of the air-conditioning control apparatus 300, the first embodiment of the present invention.

First, the differential inlet air temperature calculating block 304a executes three-dimensional airflow simulation (airflow analysis) with respect to index j=1 (step S10).

To be more specific, the differential inlet air temperature calculating block 304a uses general analyzing software to execute three-dimensional airflow simulation with the following factors as boundary conditions: the position information p(i) relating to the ith unit; and the air flow rate Q(i) through the ith unit.

In this case, the position information p(i) relating to each unit is entered from the keyboard 302 and stored within the DB 310b. In addition, the air flow rate Q(i) through each unit is transmitted therefrom via the communications network NW to the air-conditioning control apparatus 300 and stored within the DB310b. The differential inlet air temperature calculating block 304a reads out the position information p(i) and flow rate Q(i) relating to each unit, from the DB 310b and uses both as the boundary conditions.

The differential inlet air temperature calculating block 304a imparts a unit amount of heat only to the jth unit (step S20).

More specifically, the differential inlet air temperature calculating block 304a sets the boundary conditions so that the temperature of the air at the outlet of a jth unit is $T_{out}(j)$ and that its variation $\Delta T_{out}(j)$ is $\delta_{ij} * T_{unit}$. Here, $\delta_{ij}$ denotes Kronecker delta and $T_{unit}$ denotes a unit temperature (e.g., 1° C.).

Next, the differential inlet air temperature calculating block 304a executes three-dimensional temperature simulation (heat transfer analysis) with respect to index i=1 (step S30).

More specifically, the differential inlet air temperature calculating block 304a calculates the variation $\Delta T_{in}(i)$ in the temperature of the air at the inlet port of the ith unit in accordance with the values that were set in steps S10 and S20, that is, the air flow rate Q(i), and the variation $\Delta T_{out}(j)$ in the temperature of the air at the outlet port of the jth unit.

In step S40, the temperature sensitivity calculating block 304b calculates the temperature sensitivity a(i, j) from both a value that was obtained as a result of the three-dimensional temperature simulation in step S30: the variation $\Delta T_{in}(i)$ in the temperature of the air at the inlet port of the ith unit; and the assigned boundary conditions of $\Delta T_{out}(j) = \delta_{ij} * T_{unit} = T_{unit}$" (when i=j). The temperature sensitivity calculating block 304b stores the calculated temperature sensitivity a(i, j) into the DB 310b.

In step S50, the temperature sensitivity calculating block 304b determines whether the index "i" is smaller than the number of units, N. If the temperature sensitivity calculating block 304b determines the index "i" to be smaller than the number of units, N, that is, if the determination in step S50 results in 'Yes,' the temperature sensitivity calculating block 304b increments the index "i" by 1 and returns the process to step S40.

Conversely if the index "i" is determined to be larger than or equal to the number of units, N, that is, if the determination in step S50 results in 'No,' the temperature sensitivity calculating block 304b increments the index "j" by 1 (step S60).

In step S70, the inlet air temperature calculating block 304c determines whether the index "j" is smaller than the number of units, N. If the inlet air temperature calculating block 304c determines the index "j" to be smaller than the number of units, N, that is, if the determination in step S70 results in 'Yes,' the inlet air temperature calculating block 304c returns the process to step S20.

Conversely if the inlet air temperature calculating block 304c determines the index "j" to be larger than or equal to the number of units, N, that is, if the determination in step S70 results in 'No,' then in step S80 the inlet air temperature calculating block 304c uses equation (2) to calculate the temperature $T_{in}(i)$ of the air at the inlet port of the ith unit, from both the temperature sensitivity a(i, j) that was obtained in step S40, and the assigned boundary condition of the temperature $\Delta T_{out}(j)$.

In step S90, the maximum value determining block 304d determines the maximum value M from all inlet air temperatures $T_{in}(i)$, where i=1 to N.

In step S100, the air conditioner control block 304e controls the set temperature of the air conditioner 200 to prevent the maximum value M of the inlet air temperatures $T_{in}(i)$ from exceeding a predetermined threshold value.

For example, the air conditioner control block 304e controls the set temperature of the air conditioner 200 to prevent the maximum value M of the inlet air temperatures $T_{in}(i)$ from exceeding a maximum value (e.g., 35° C.) of an allowable operating temperature (e.g., 15 to 35° C.) of the information-processing unit 100.

As set forth above, in accordance with the present embodiment, overall power saving in the data center can be achieved with a simplified configuration.

(Variant)

The air flow rate Q(i) through the ith unit may be rendered changeable in steps by changing the amount of power supplied to the fan. The air-conditioning control apparatus 300 will control the amount of power supplied to the fan.

For example, suppose that a value of the flow rate at a first unit, Q(1), is set to be 1, a value of the flow rate at a second unit, Q(2), is set to be 2, and in this way, a value of the flow rate at up to an Nth unit, Q(N), is set to be a constant of "k".

Figure 7:
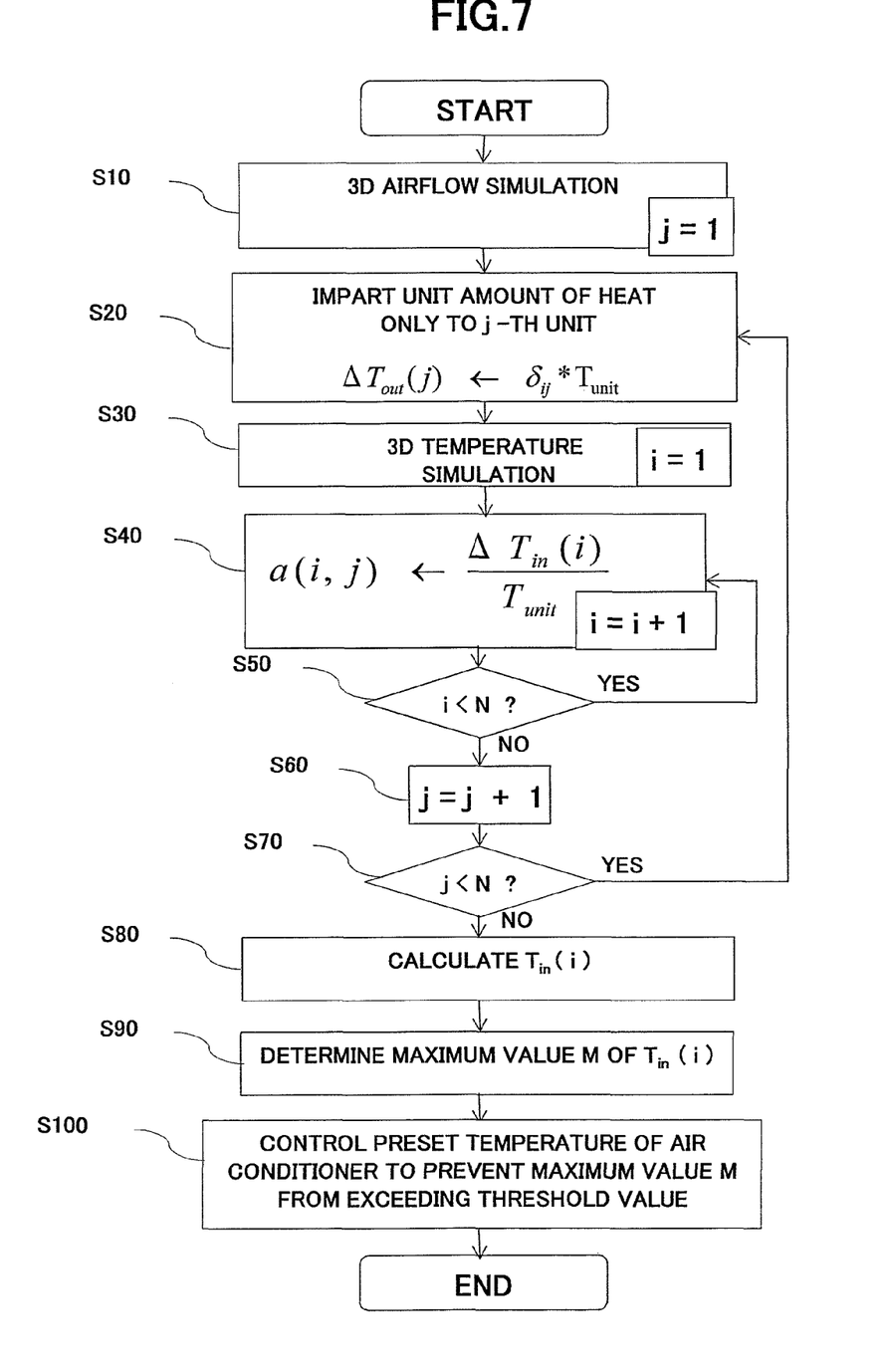
FIG. 7 is a flowchart that shows an operation sequence of the air-conditioning control apparatus, the first embodiment of the present invention.

In this case, the inlet air temperature can be predicted if the successive steps that were described using FIG. 7 are conducted upon all combinations of the flow rate Q(i) and then the temperature sensitivity a(i, j) is determined as a function of Q(i).

The analysis as described above, however, may not need to be conducted for all combinations of the flow rate Q(1). In most cases, the inlet air temperature can be predicted by calculating a(i, j) for a typical combination of the flow rate Q(i) and calculating a(i, j) for all other combinations by use of a suitable interpolation or extrapolation function. This is because a variation in the flow rate q(i, j) with respect to a variation in Q(i) has good linearity.

The combination of the flow rate Q(i) which lacks such linearity should actually not be adopted, since the lack of the linearity indicates that the heat stagnation under which temperature continues to increase is occurring.

Second Embodiment

Next, operation of an air-conditioning control apparatus 300, a second embodiment of the present invention, is described below using FIGS. 8 and 9. An overall configuration of a data center 400 including the air-conditioning control apparatus 300, the second embodiment of the present invention, is the same as the configuration shown in FIG. 1.

First, a configuration of one information-processing unit 100 placed in the data center 400 including the air-conditioning control apparatus 300, which is the second embodiment of the present invention, is described below using FIG. 8. FIG. 8 is a configuration diagram of the information-processing unit 100 installed in the data center 400 including the air-conditioning control apparatus 300, the second embodiment of the present invention. For depictive simplicity, only one IT device 101 is shown in FIG. 8.

A sensor $S_F$ that senses and measures temperature of air which flows into an IT device rack 100R is mounted in a front panel of the rack. In addition, a sensor $S_E$, that senses and measures temperature of air discharged from the IT device rack 100R is mounted in a back panel of the rack. The temperatures $TS_{in}(i)$ and $TS_{out}(i)$ that have been respectively measured by the sensors $S_F$ and $S_B$ are transmitted to the air-conditioning control apparatus 300 and stored into a database (DB) 310b.

Figure 8:
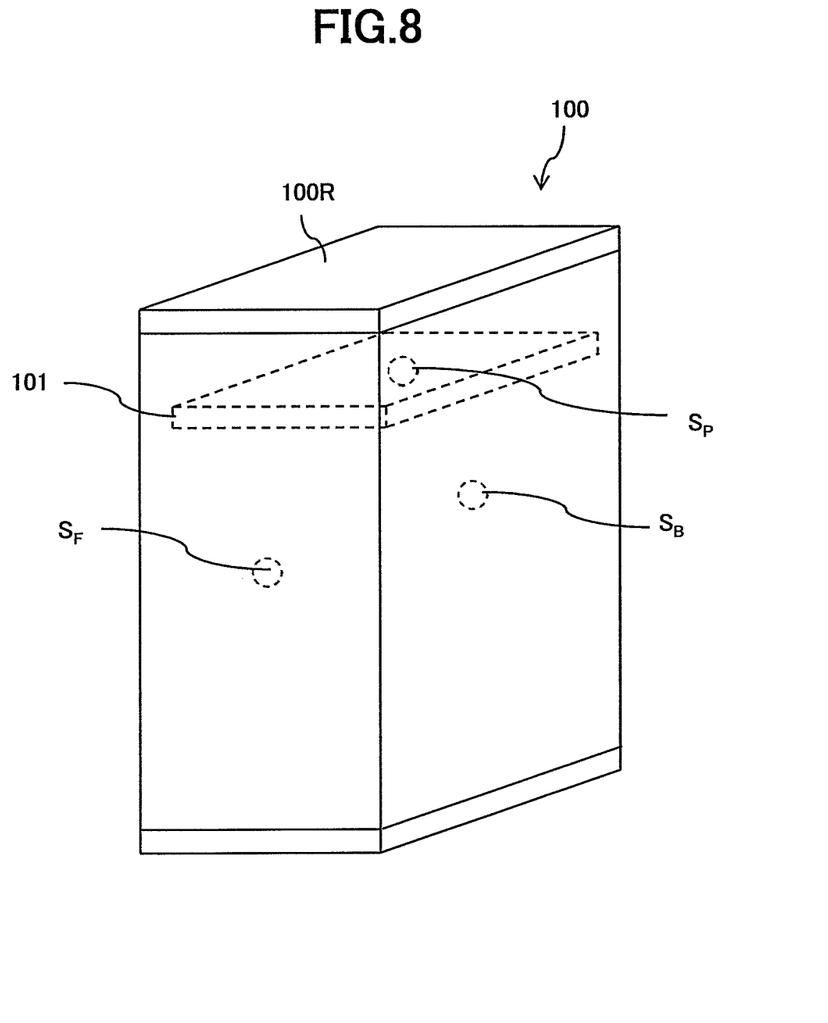
FIG. 8 is a configuration diagram of an information-processing unit installed in a data center including an air-conditioning control apparatus which is a second embodiment of the present invention.

Positions of the sensors $S_F$ and $S_B$ are not limited to those shown in FIG. 8. In addition, an infrared camera disposed on a ceiling of a computer room R may be used instead of the sensors $S_F$ and $S_B$.

The IT device 101 further includes a sensor Sp that measures the amount of electric power consumed by the IT device. The power consumption P(i) that has been measured by the sensor Sp is transmitted to the air-conditioning control apparatus 300 and stored into the database (DB) 310b.

Next, functions of the air-conditioning control apparatus 300, the second embodiment of the present invention, are described below using FIG. 9. FIG. 9 is a diagram for describing the functions of the air-conditioning control apparatus 300, the second embodiment of the present invention. In FIG. 9, the same elements as in FIG. 6 are each assigned the same reference number.

Figure 9:
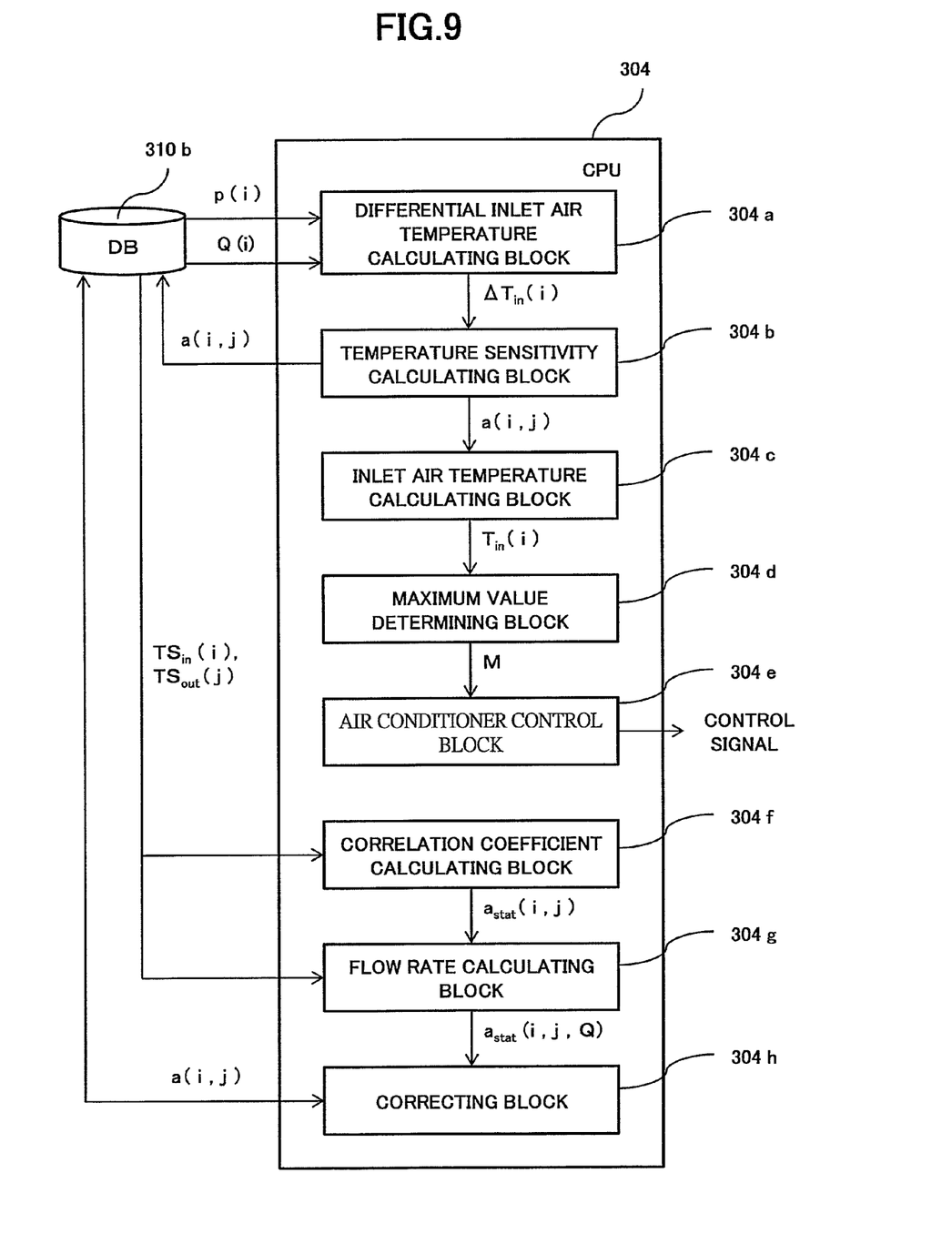
FIG. 9 is a diagram for describing functions of the air-conditioning control apparatus, the second embodiment of the present invention.

FIG. 9 differs from FIG. 6 in that a correlation coefficient calculating block (a correlation coefficient calculator) 304f, a flow rate calculating block (a flow rate calculator) 304g, and a correcting block (a corrector) 304h are added.

In accordance with equation (2), the correlation coefficient calculating block 304f statistically calculates temperature sensitivity $a_{stat}(i, j)$ as a correlation coefficient of a measured temperature $TS_{in}(i)$ of the air at an inlet port of each unit and a measured temperature $TS_{out}(j)$ of the air at an outlet port of the unit, and supplies the calculated temperature sensitivity $a_{stat}(i, j)$ to the flow rate calculating block 304g.

The flow rate calculating block 304g calculates a flow rate $Q_2(i)$ of the air in the unit, in accordance with following equation (8):

$$Q_2(i) = (TS_{out}(i) - TS_{in}(j)) * m_f * \gamma \qquad (8)$$

where "$m_f$" denotes a mass flow rate and "$\gamma$" denotes specific heat of the air.

The flow rate calculating block 304g calculates temperature sensitivity $a_{stat}(i, j, Q)$ as a function of the flow rate $Q_2(i)$, from the calculated flow rate $Q_2(i)$ and the temperature sensitivity $a_{stat}(i, j)$ that has been supplied from the correlation coefficient calculating block 304f. This calculation enables prediction accuracy of the inlet air temperature to be enhanced as operation progresses.

The flow rate calculating block 304g supplies the temperature sensitivity $a_{stat}(i, j, Q)$ to the correcting block 304h.

The correcting block 304*h* implements a comparison between the temperature sensitivity a(i, j) calculated for the flow rate at each unit Q(i), by the temperature sensitivity calculating block 304*b*, and the temperature sensitivity $a_{stat}$(i, j, Q) calculated by the flow rate calculating block 304*g*. If a difference between both is greater than or equal to a predetermined threshold value, the temperature sensitivity a(i, j) that has been stored into the DB 310*b* is updated to $a_{stat}$(i, j, Q).

As described above, in accordance with the present embodiment, the temperature sensitivity a(i, j) can be corrected automatically to follow an actual operation state.

(Variant)

In the second embodiment, the flow rate calculating block 304*g* may be omitted. In this case, the correlation coefficient calculating block 304*f* supplies the calculated temperature sensitivity $a_{stat}$(i, j) to the correcting block 304*h*. If the difference between the temperature sensitivity a(i, j) stored within the DB 310*b* and the temperature sensitivity $a_{stat}$(i, j) supplied from the correlation coefficient calculating block 304*f* is greater than or equal to a predetermined threshold value, the temperature sensitivity a(i, j) within the DB 310*b* is updated to the temperature sensitivity $a_{stat}$(i, j).

In addition, the correlation coefficient calculating block 304*f* and the flow rate calculating block 304*g* may calculate one of the temperatures $T_{in}$(i) and $T_{out}$(i) that were measured by the temperature sensors $S_F$ and $S_B$, respectively, from the other of the two temperatures and the power consumption P(i) that was measured by the power sensor Sp, and use the calculated temperature.

Third Embodiment

Next, operation of an air-conditioning control apparatus 300, a third embodiment of the present invention, is described below using FIG. 10. An overall configuration of a data center 400 including the air-conditioning control apparatus 300, the third embodiment of the present invention, is the same as the configuration shown in FIG. 1.

Figure 10:
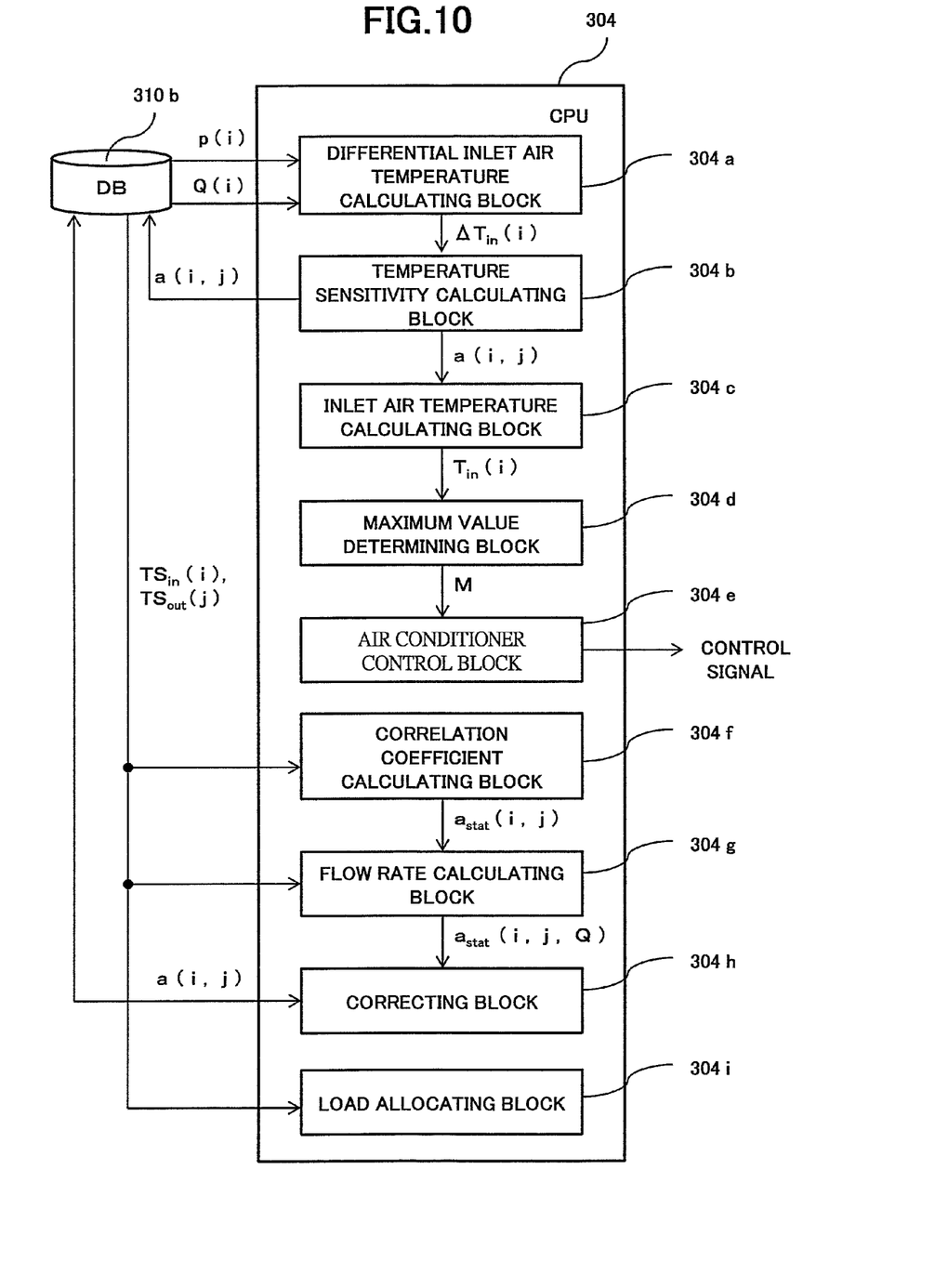
FIG. 10 is a diagram for describing functions of an air-conditioning control apparatus which is a third embodiment of the present invention.

FIG. 10 is a diagram for describing functions of the air-conditioning control apparatus 300 which is the third embodiment of the present invention.

FIG. 10 differs from FIG. 9 in that a load allocating block (a load allocator) 304*i* is added. On the basis of a difference ΔTS between a measured temperature $TS_{in}$(i) of air at an inlet port of each unit and a measured temperature $TS_{out}$(j) of the air at an outlet port of the unit, the load allocating block 304*i* allocates a load (process) of a heavily loaded unit (a unit great in ΔTS) to a lightly loaded unit (a unit small in ΔTS). The load allocating block 304*i* may allocate a load from a unit higher in power consumption P(i), to a unit lower in P(i).

As described above, in the present embodiment, a(i, j) can be calculated from the differences between variations in temperature by changing the loads of the air-conditioning control apparatus 200 and the information-processing units 100 independently and measuring the corresponding inlet air temperatures of each unit. In addition, operation can be controlled to an optimal operation state automatically by searching for the optimal operation state from a small quantity of a variation in the temperature of air.

It is to be noted that the present invention is not limited to the aforementioned embodiments, but covers various modifications. While, for illustrative purposes, those embodiments have been described specifically, the present invention is not necessarily limited to the specific forms disclosed. Thus, partial replacement is possible between the components of a certain embodiment and the components of another. Likewise, certain components can be added to or removed from the embodiments disclosed.

For example, the air-conditioning control apparatus 300 may include a sensor information management function block that manages the information sent from the IT devices 101 and the air conditioners 200 via the network NW, such as information relating to temperature, the quantity of air, and power consumption. The air-conditioning control apparatus 300 may also include a load information management function block that acquires and manages information about a current working load and scheduled future load of each IT device 101, and a function block that picks and sets an appropriate load allocation state for each IT device 101 with respect to the scheduled load using the information that the load information management function block manages. The air-conditioning control apparatus 300 may further include a function block that picks and sets appropriate operating conditions such as the quantity and temperature of air, for the air conditioners 200, a workload allocation block that determines the workloads to be allocated to each unit, and a workload control block that controls the workloads of each unit.

These function blocks may be disposed inside one air-conditioning control apparatus 300 or distributed in a plurality of apparatuses.

The sensor information management function block that manages information relating to inlet air temperatures of servers may be omitted if the air-conditioning sensitivity of each unit, based on the information relating to the inlet air temperature of the unit, is already obtained and needs no changing.

What is claimed is:

1. An air-conditioning control apparatus having a memory, a processor, and a storage device coupled thereto, the air-conditioning control apparatus being configured to:

calculate a variation $\Delta T_{in}$(i), where i=1 to N, in air temperature at an inlet port of an ith information-processing unit, where N is a total number of information processing units, based on position of the ith unit and an air flow rate through the ith unit, wherein the air flow rate through the ith unit is measured by a fan speed sensor operatively connected with the processor, and wherein the air flow rate through the ith unit is measured by a fan speed sensor operatively connected with the processor, and wherein the air temperature at the inlet port of the ith information-processing unit is measured by a first sensor operatively connected with the processor, wherein the first sensor is at least one of a first temperature sensor or a first infrared camera;

calculate a first temperature sensitivity a(l, j) by dividing the variation by a variation $T_{out}$(j), where j=1 to N, in air temperature at an outlet port of a jth unit, wherein the air temperature at the outlet port of the jth unit is measured by at least one of a second temperature sensor operatively connected with the processor or a second infrared camera operatively connected with the processor;

calculate a first temperature sensitivity a(i, j) by dividing the variation $\Delta T_{in}$(i) by a variation $T_{out}$(j), where j=1 to N, in air temperature at an outlet port of a jth unit, based on the position of the jth unit and an air flow rate through the jth unit, wherein the air flow rate through the jth unit is measured by a second fan speed sensor operatively connected with the processor, wherein the air temperature at the outlet port of the jth unit is measured by a second sensor operatively connected with the processor, wherein the second sensor is at least one of a second temperature sensor or a second infrared camera;

calculate an air temperature $\Delta T_{in}(i)$ at the inlet port of the ith unit based on an air temperature $T_{out}(j)$ at an outlet port of the jth unit and the calculated first temperature sensitivity $a(i, j)$;

determine a maximum value M of the temperature $\Delta T_{in}(i)$; and control a temperature setting of at least one air conditioner to prevent the maximum value M from exceeding a predetermined threshold value.

2. The air-conditioning control apparatus according to claim 1, further configured to:

calculate a second temperature sensitivity $a_{stat}(i, j)$ of a first measured temperature $TS_{in}(i)$ of air at the inlet port of the ith unit, as received from the first sensor, and a second measured temperature $TS_{out}(j)$ of air at the outlet port of the jth unit, as received from the second sensor.

3. The air-conditioning control apparatus according to claim 2, further configured to:

update the first temperature sensitivity $a(i, j)$ that has been stored into the storage device to the second temperature sensitivity $a_{stat}(i, j)$ when a difference between the first temperature sensitivity $a(i, j)$ and the second temperature sensitivity $a_{stat}(i, j)$ is greater than or equal to a predetermined threshold value.

4. The air-conditioning control apparatus according to claim 3, further configured to:

allocate loads between information-processing units.

5. The air-conditioning control apparatus according to claim 2, further configured to:

calculate a heat transfer rate $Q_2(i)$ through the ith unit based on a mass flow rate and specific heat of air;

calculate an air flow temperature sensitivity $a_{stat}(i, j, Q_2)$ based on the heat transfer rate $Q_2(i)$ and the second temperature sensitivity $a_{stat}(i, j)$; and update the temperature sensitivity $a(i, j)$ that has been stored into the storage device to the air flow temperature sensitivity $a_{stat}(i, j, Q_2)$ when the difference between the temperature sensitivity $a(i, j)$ and the air flow statistical temperature sensitivity $a_{stat}(i, j, Q_2)$ is greater than or equal to a predetermined threshold value.

* * * * *